United States Patent [19]

Shimada

[11] Patent Number: 5,200,577
[45] Date of Patent: Apr. 6, 1993

[54] SUPERCONDUCTING WIRE

[75] Inventor: Mamoru Shimada, Sayama, Japan

[73] Assignee: Kabushiki Kaisha Toshiba, Kawasaki, Japan

[21] Appl. No.: 714,616

[22] Filed: Jun. 13, 1991

[30] Foreign Application Priority Data

Jun. 13, 1990 [JP] Japan .................................. 2-152594
May 24, 1991 [JP] Japan .................................. 3-120376

[51] Int. Cl.$^5$ ............................................. H01B 12/00
[52] U.S. Cl. ................................... 174/125.1; 505/884; 505/887
[58] Field of Search ............... 505/704, 705, 884, 885, 505/886, 887; 174/125.1, 15.4, 15.5

[56] References Cited

U.S. PATENT DOCUMENTS

| | | | |
|---|---|---|---|
| 3,366,728 | 1/1968 | Garwin et al. | 174/125.1 |
| 3,702,373 | 11/1972 | Ecomard et al. | 174/125.1 |
| 4,078,299 | 3/1978 | Furuto et al. | |
| 4,336,420 | 6/1982 | Benz | 174/125.1 |
| 4,586,012 | 4/1986 | Koizumi et al. | 335/216 |
| 4,617,789 | 10/1986 | Borden | |
| 4,646,428 | 3/1987 | Marancik et al. | 29/599 |
| 4,743,713 | 5/1988 | Scanlan | 174/125.1 |
| 4,763,404 | 8/1988 | Coffey et al. | 174/125.1 |
| 4,947,637 | 8/1990 | Royet et al. | |

FOREIGN PATENT DOCUMENTS 1179896 2/1970 United Kingdom ............. 174/125.1

OTHER PUBLICATIONS

Cryogenics, vol. 19, No. 6, pp. 327-332, Jun., 1979, D. T. Read, et al., "Definitions of Terms for Practical Semiconductors 3. Fabrication, Stabilization and Transient Losses".

Etz Elektrotechnische Zeitschrift, vol. 110, No. 13, pp. 668-673, Jul., 1989, A. Ulbricht, "Supraleitung in der Kernfusion".

Patent Abstracts of Japan, vol. 92, No. 15, (M-409), Sep. 3, 1985, & JP-A-60-076-237, M. Shinichirou, et al., "Production of Twisted Wire Having Non-Circular Section".

Primary Examiner—Leo P. Picard
Assistant Examiner—B. Lee Ledynh
Attorney, Agent, or Firm—Oblon, Spivak, McClelland, Maier & Neustadt

[57] ABSTRACT

A superconducting wire is formed by twisting a bundle of a plurality of superconducting material filaments in which one material filament is arranged in a central portion of the filament bundle and a plurality of other material filaments arranged outside the central material filament so as to surround the central one. The filament bundle is twisted in that the central material filament is substituted with another one of outer material filaments one by one in order periodically during a twisting process along an axial direction of the filament bundle. A super-conducting cable is formed by twisting a bundle of a plurality of superconducting material wires with each other about a core member arranged at a central portion of the bundle and each of the superconducting material wire is essentially composed of the material filaments of the characters described above, wherein substituting positions of the central material filaments and outer material filaments in the respective superconducting material wires are shifted with each other along an axial direction of the material wire bundle.

2 Claims, 5 Drawing Sheets

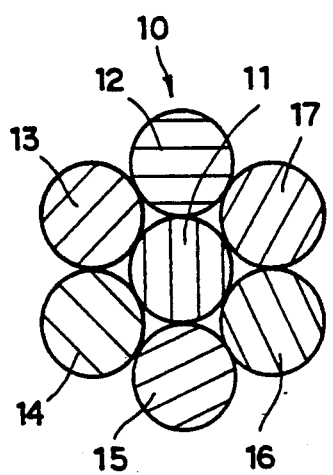
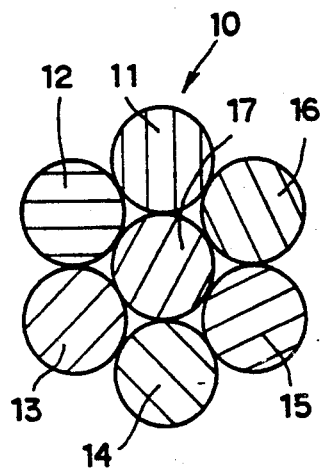
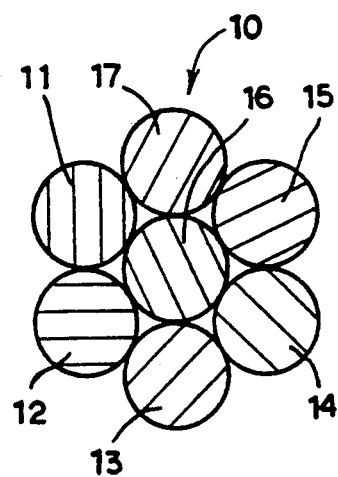
FIG.1A    FIG.1B    FIG.1C
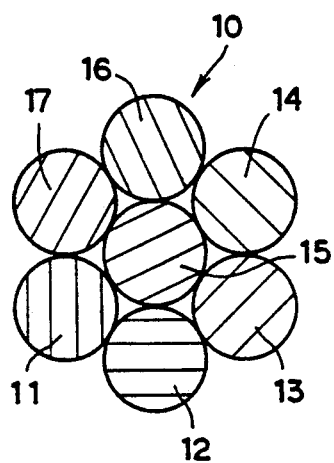
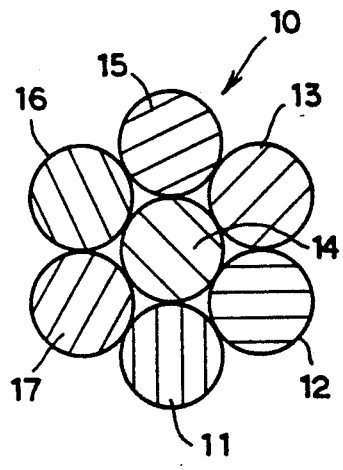
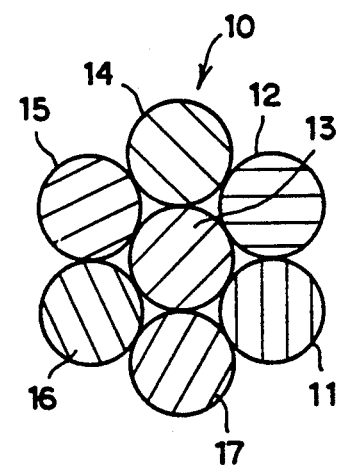
FIG.1D    FIG.1E    FIG.1F
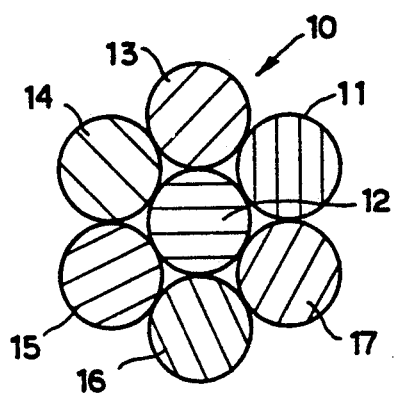
FIG.1G

SUPERCONDUCTING WIRE

BACKGROUND OF THE INVENTION

The present invention relates to a superconducting wire or cable having a twisted filament structure utilized for a superconducting device operative with commercial frequency.

In a conventional technique, an A.C. superconducting wire is formed of an extremely fine multiconductor wire composed of tens of thousands of superconducting filaments each having a diameter less than 1 $\mu$m. According to the realization of such technique, the electricity loss in the A.C. excitation has been reduced. However, the material of each filament is made extremely thin, so that one superconducting filament material has a current capacity only of about several tens of amperes (A).

In order to make large the current capacity, there has been proposed a superconducting wire having twisted filament structure, and in a certain case, a plurality of the thus twisted filament structures are further twisted to obtain further increased current capacity, such as shown in "Development of KA-class Superconducting Cables for AC use", by T. Hamajima, 11th *Magnet Technology*, 610 (1989).

Generally, the superconducting wire has an electric resistance which becomes zero at a very low temperature, and accordingly, when an electric current is supplied to a twisted filament type superconducting wire from an external power source, a mode of shunt electric current is determined in accordance with inductances of the respective superconducting material filaments constituting the superconducting wire or cable and a connection resistance between the power source and the respective superconducting material filaments.

However, in a case where an alternating current having a commercial frequency such as of 50 or 60 Hz, or more is conducted, the resistance caused by the inductance is mainly weighed and, hence, the shunt current is decided only by the inductance. For this reason, when an alternating current having the commercial frequency or more is conducted to a superconducting wire of conventional structure, a current is not flown uniformly through the respective superconducting material filaments due to the difference in the inductances between an inside superconducting material filament and outside ones in a bundle of filaments. This may be caused by the fact that the positions or arrangements of the respective material filaments are not changed even if the filaments are twisted. Namely, an inside filament is always positioned inside and an outside filament is always positioned outside.

In the meantime, when a plurality of the superconducting wires each of the structure described above are twisted, there causes a case where a current flows, in a converged manner, only in a certain specific superconducting wire, and in an extreme case where the currents exceeds the critical current value for the specific superconducting wire, a state of the superconducting wire will transfer to a normal-conducting state from the superconducting state. For the reason described, in the conventional technique, it is extremely diffcult to provide an A.C. superconducting wire or cable particularly adapted for large electric current capacity.

SUMMARY OF THE INVENTION

An object of the present invention is to substantially eliminate defects or drawbacks encountered in the prior art and to provide an A.C. superconducting wire or cable capable of uniformly flowing the current to the respective superconducting material filaments even in the large current capacity in a case where an A.C current having the commercial frequency or more is flown.

This and other objects can be achieved according to the present invention by providing a superconducting wire formed by twisting a bundle of a plurality of superconducting material filaments with each other, the superconducting wire comprising a material filament arranged in a central portion of the filament bundle and a plurality of material filaments arranged outside the central material filament so as to surround the central one, wherein the filament bundle is twisted ,in a maner that the central material filament is substituted with another one of outer material filaments one by one in order periodically along an axial direction of the filament bundle.

A superconducting cable is formed by twisting a bundle of a plurality of superconducting material wires with each other about a core member arranged at a central portion of the bundle, each of the superconducting material wires is essentially composed of the material filaments of the characters described above, wherein substituting positions of the central material filaments and outer material filaments in the respective superconducting material wires are shifted with each other along an axial direction of the material wire bundle.

According to the superconducting wire or cable of the characters described above, since the superconducting wire is composed of a plurality of material filaments with substantially equal positional arrangement periodically along the axial direction thereof, the inductance thereof is substantially made equal throughout the axial direction of the superconducting wire, and accordingly, the electric current can uniformly flows in the respective material filaments, thus being suitably adapted for large electric capacity.

BRIEF DESCRIPTION OF THE DRAWINGS

In the accompanying drawings:

FIGS. 1A to 1G are cross sectional views of a bundle of material filaments constituting a superconducting wire according to the present invention, representing various positions taken along the axial direction of the bundle;

DESCRIPTION OF THE PREFERRED EMBODIMENTS

FIGS. 1A to 1G show sectional views respectively of different portions of a superconducting wire 10 of the present invention taken along the axial direction thereof. In the illustration of FIG. 1, the superconducting wire 10 is composed of a bundle of a plurality, seven for example, superconducting material filaments 11 to 17 which are twisted, in which one material filament is centrally arranged and the other six material filaments are arranged outside so as to surround the central one. This arrangement is itself identical to that of the conventional superconducting wire. According to the present invention, however, the central material filament is substituted with another outside material filament one by one periodically in position during the twisting process along the axial direction of the superconducting wire 10 so as to provide sectional views as shown in FIGS. 1A to 1G.

Each of the material filaments 11 to 17 constituting the superconducting wire 10 has a diameter d less than 1 mm$\phi$ and a length of, for example, several km or several tens km and is mainly composed of a superconductive material such as NbTi or Nb$_3$Sn.

Figure 2:
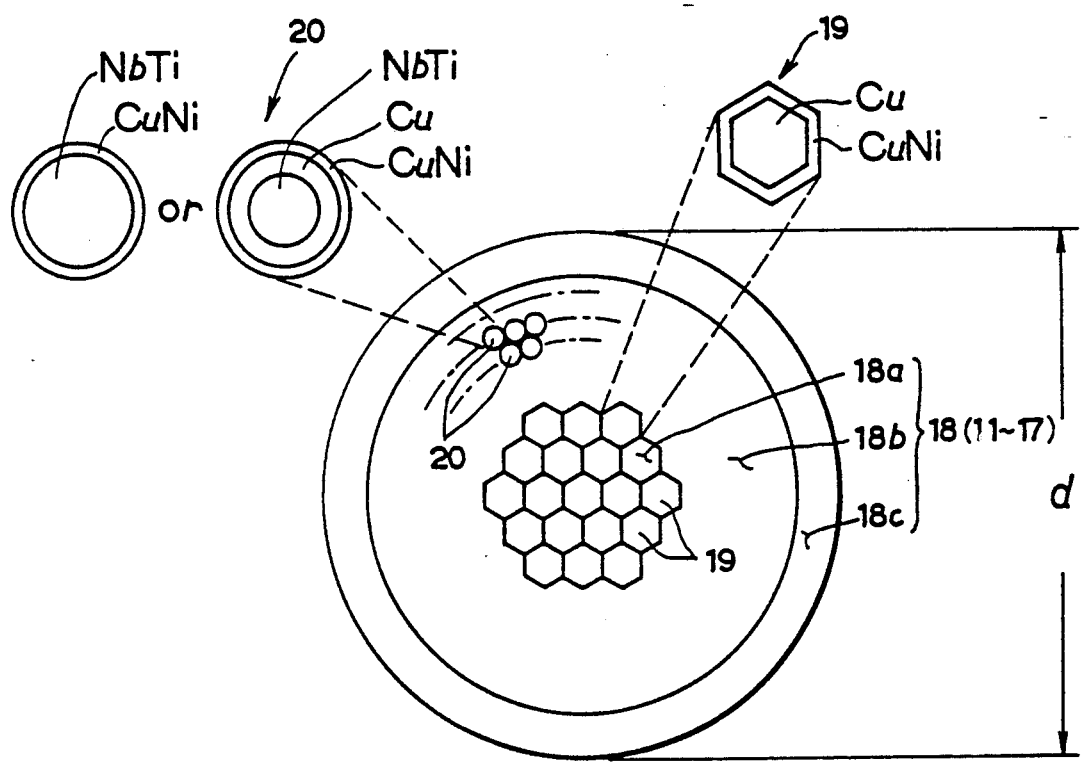
FIG. 2 is a view showing a structure of each of the material filaments of FIG. 1.

FIG. 2 shows an example of a superconducting material filament 18 mainly composed of NbTi material and has a diameter of 0.165 mm$\phi$. The superconducting material filament 18 has a three-layer structure as a whole and has a central core 18a. The central core 18a has a structure of honeycomb matrix in which a plurality of stabilized copper materials 19 each formed by covering a copper material Cu with CuNi (Cu-10wt % Ni) material are arranged. NbTi mateial filaments 20 are tightly arranged in an intermediate layer 18b outside the matrix. A filament portion is thus constituted. A sheath portion 18c outside the filament portion 18b is composed of a CuNi material layer.

Although in the above, the NbTi material filament 20 has a three-layer structure in which NbTi material is covered by Cu and CuNi materials, the filament 20 may have a two-layer structure in which NbTi material is covered with CuNi. The NbTi filament 20 has a core portion (NbTi) having a diameter of 0.63 $\mu$m$\phi$, for example.

The superconducting material filament 18 (11 to 17) is composed of the central stabilized copper 19 of Cu/-CuNi and the outer NbTi material filament 20, and the surface thereof is covered with CuNi material layer 18c. The superconducting material filament 18 is provided with no insulating layer.

The superconducting wire 10 is composed of, as shown in FIGS. 1A to 1G, seven superconducting material filaments 11 to 17 by twisting them. When these bundled material filaments are twisted clockwisely along the axial direction thereof by a predetermined length, for example, several cm, the central material filament 11 in FIG. 1A is substituted with another material filament 17 as shown in FIG. 1B, which is positioned outside in FIG. 1A cross section, and the material filament 11 is hence displaced outside. When the bundled material filaments are further twisted clockwisely along the axial direction thereof by the predetermined length, the material filament 17 is substituted with another material filament 16 as shown in FIG. 1C. In substantially the same manner, the central material filament is substituted with another material filament periodically one by one as shown in FIGS. 1D to 1G. Finally, the twisted state returns to a position represented by FIG. 1A with the material filament 11 being the center of the bundle in cross section. It is of course possible to twist the bundled matrerial filaments counterclockwisely.

Figure 3:
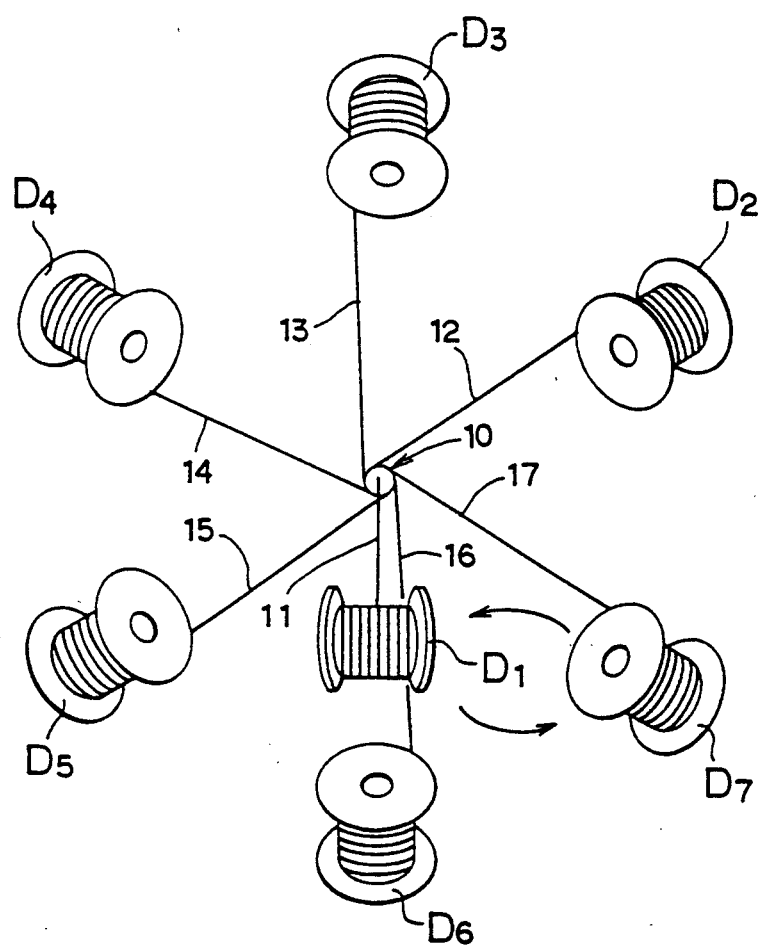
FIG. 3 shows an arrangement of winding jigs for twisting the material filaments of FIG. 1.

The provision of such twisted superconducting material filaments may be carried out by alternatively utilizing winding jigs for feeding the material filaments 11 to 17. Namely, FIG. 3 shows one example of arrangement of the jigs D1 to D7. When it is required to substitute the superconducting material filament 11 with the superconducting material filament 17 (i.e. to change the condition of FIG. 1A to FIG. 1B), the jig D7 around which the material filament 17 is wound is changed in position in substitution for the jig D1 around which the material filament 11 is wound. In the actual twisting process with reference to FIG. 3, six winding jigs are rotated with one winding jig (D1 in FIG. 3) being the center of the rotation of these jigs D2 to D7. According to such winding and twisting manner, the superconducting wire 10 is formed, in which the inside central material filament is periodically substituted one by one along the twisted axial direction as shown in FIGS. 1A to 1G, whereby the inductances of the respective superconducting material filaments 11 to 17 can be made coincident with each other throughout the axial direction of the superconducting wire 10.

Figure 4:
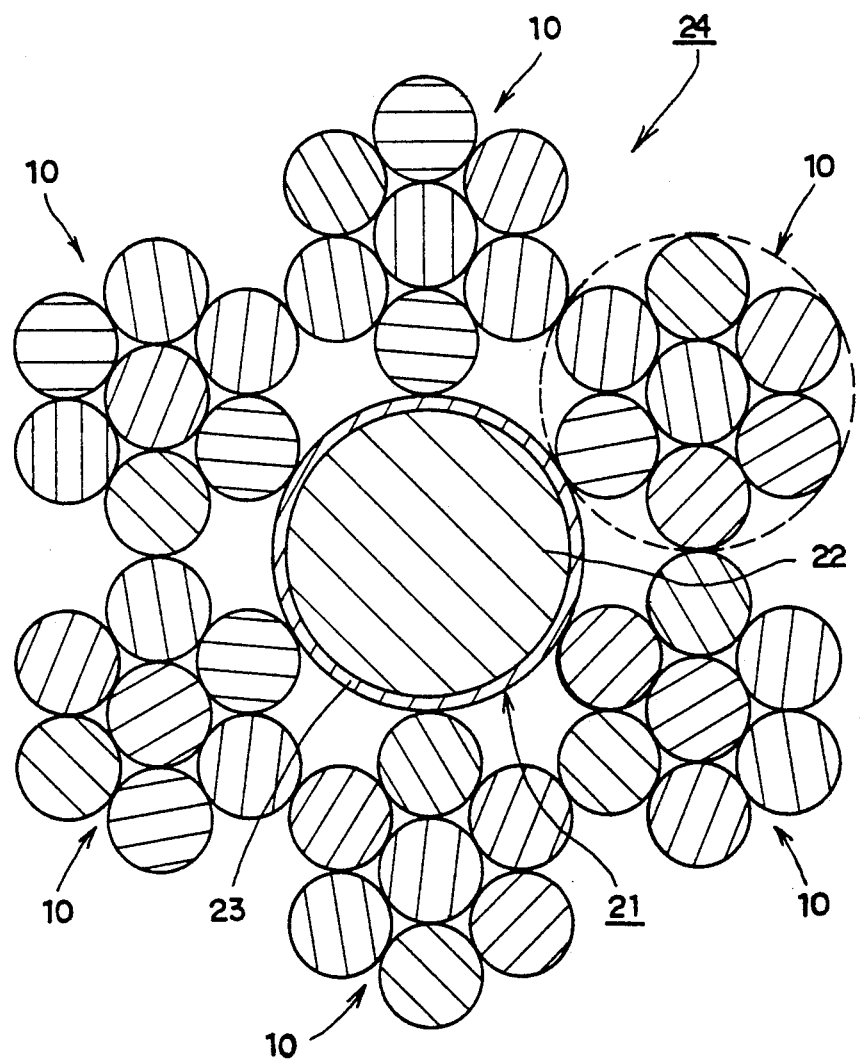
FIG. 4 is a cross sectional view of a superconducting cable of another embodiment of the present invention, which utilizes the superconducting wire shown in FIG. 1.

FIG. 4 shows a cross sectional view of a superconducting wire or cable of another embodiment of the present invention, in which a superconducting wire or cable (called cable 24 herein) is composed of a plurality, six in the illustration, of superconducting wires, as a sub- or primary twisted material wire, each having the structure of the superconducting wire 10 of the aforementioned embodiment, and the superconducting cable 24 is formed by arranging a reinforcing core material 21 at a central portion and six primary twisted material wires 10 are arranged outside thereof and the primary twisted material wires 10 are twisted around the central core material 21. The core material 21 is formed of a stainless steel wire 22 and an insulating material 23 such as of a material of polyimide series resin applied to the outer peripheral surface of the stainless steel wire 21.

In this embodiment, as described with reference to FIG. 1, the central material filament of each primary twisted material wire 10 is substituted with another material filament one by one with equal intervals along the axial direction of the wire 10. As shown in FIG. 4, in the actual twisting time, central material filaments of the respective primary twisted wires 10 are shifted in positions with each other at a time when these wires 10 are twisted about the central core material 21. Accordingly the material filaments of the respective primary twisted wires 10 are shifted in positions in a final product of the superconducting cable 24, thus significantly reducing influence to the outer shape thereof at the respective substituting positions of the primary twisted wires 10.

According to this embodiment, the current distribution in each of the primary twisted wire 10 is made substantially uniform and, hence, the unifomity of the current distribution as a whole structure of the superconducting cable 24 can be achieved. The location of the reinforcing central core 21 can improve the mechanical strength of the superconducting cable 24 as a final product.

Figure 5:
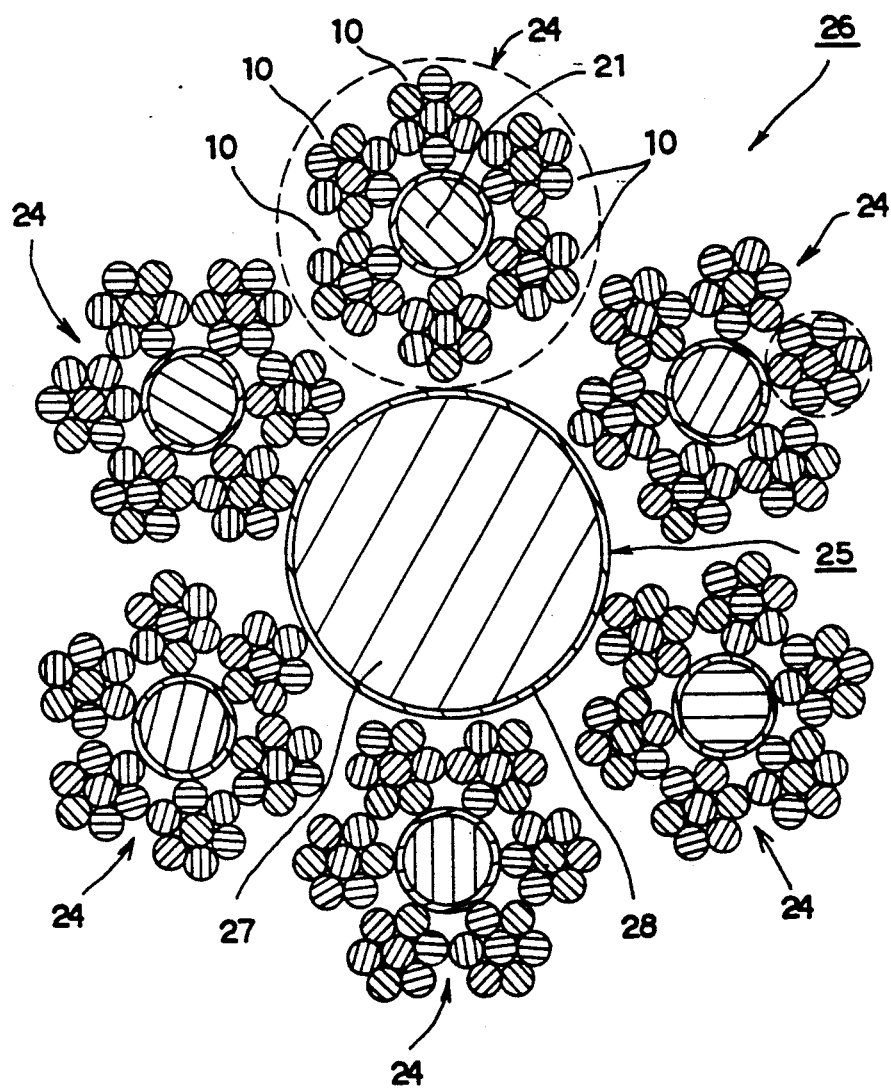
FIG. 5 is a cross sectional view of a superconducting cable of a further embodiment of the present invention, which utilizes the superconducting cable shown in FIG. 4.

FIG. 5 shows a cross sectional view of superconducting cable 26 of a further embodiment according to the present invention, in which a plurality, six in the illustration, of the superconducting cables 24, each of the structure shown in FIG. 4, are twisted around a central reinforcing core material 25. In this meaning, in this embodiment, the superconducting cable 24 may be called a secondary twisted wire. In this embodiment, the central core material 25 is formed of a stainless steel wire 27 and an insulating material 28 made of such as polyimide series resin applied to the outer peripheral surface of the stainless steel wire 27. The superconducting cable 26 according to this embodiment aims to further reduce the electricity loss during the A.C. conduction.

According to the superconducting cable 26 of this embodiment, the current distribution in each of the primary twisted wire 10 is made substantially uniform and the uniformity of the current distribution of each of the secondary twisted wire, i.e. superconducting cable 24, can be achieved. The location of the reinforcing central core 25 can improve the mechanical strength of the superconducting cable 26 as a final product.

It may be possible to provide a superconducting cable by further twisting the superconducting cables 26 of FIG. 5 as tertiary twisted wire around a reinforcing central core of the structure substantially identical to that of the core material 25 of FIG. 5.

What is claimed is:

1. A superconducting wire comprising:
   a bundle including a plurality of twisted superconducting material filaments, each of said superconducting material filaments being essentially composed of a three-layer structure having a central core, an intermediate filament layer and a sheath portion arranged outside the filament layer, the central core having a structure of honeycomb matrix in which a plurality of stabilized copper materials each formed by covering a copper material with CuNi material are arranged, the intermediate filament layer having a structure in which NbTi material filaments are tightly arranged outside the matrix, and the sheath portion being composed of a CuNi material layer.

2. A superconducting wire according to claim 1, wherein said plurality of superconducting material filaments include a central superconducting material filament arranged in a central portion of the filament bundle and a plurality of outer superconducting material filaments arranged outside the central superconducting material filament so as to surround the central one, and wherein the filament bundle is twisted so that the central superconducting material filament is substituted with another one of the outer superconducting material filaments one by one in order periodically during a twisting process along an axial direction of the filament bundle so that all the superconducting material filaments subsequently occupy the central and outside positions.

* * * * *